United States Patent [19]

Gilliam

[11] Patent Number: 4,495,461
[45] Date of Patent: Jan. 22, 1985

[54] WAVEFORM CROSSING DETECTOR

[75] Inventor: John E. Gilliam, Carshalton, England

[73] Assignee: U.S. Philips Corporation, New York, N.Y.

[21] Appl. No.: 386,364

[22] Filed: Jun. 8, 1982

[30] Foreign Application Priority Data

Jun. 8, 1981 [GB] United Kingdom ............... 8117495

[51] Int. Cl.³ .......................................... G01R 25/00
[52] U.S. Cl. .................................... 324/86; 323/325; 324/83 R; 361/76
[58] Field of Search .............. 324/78 N, 86, 107, 96, 324/83 A, 83 R; 363/87, 129; 323/319, 325; 307/138; 361/44, 76

[56] References Cited

U.S. PATENT DOCUMENTS

| | | | |
|---|---|---|---|
| 3,332,008 | 7/1967 | Mueller et al. | 323/325 |
| 3,436,645 | 4/1969 | Johnson et al. | 323/325 |
| 3,659,196 | 4/1972 | Bercovitz, Jr. | 324/83 A |
| 3,746,969 | 7/1973 | Gessaroli et al. | 323/325 |
| 3,780,318 | 12/1973 | Werts et al. | 323/319 |
| 3,854,089 | 12/1974 | Emler | 324/96 |
| 4,024,439 | 5/1977 | McClain et al. | 361/76 |
| 4,119,905 | 10/1978 | Head | 323/325 |
| 4,176,288 | 11/1979 | Komatsu et al. | 323/319 |

OTHER PUBLICATIONS

G. Oliver et al., "Optoisolators Slash Cost of Three-Phase Detector", in *Electronics*, Nov. 23, 1978, p. 146.

Primary Examiner—Stewart J. Levy
Attorney, Agent, or Firm—Bernard Franzblau

[57] ABSTRACT

A waveform crossing detector circuit for a pair of waveforms of a three-phase AC supply applied to respective input terminals (7,8,9). The circuit includes a pair of opto-couplers (1,3; 2,4) for isolating an output terminal (21) from the supply. In order to obtain an accurate indication of the instants of crossing the light-emitting diodes (1,2) of the couplers are driven by respective transistors (5,6) which act as the actual crossing detectors. The collector circuits of these transistors are driven from the third phase, the potential of which is at a maximum when the relevant instants occur. Two further such arrangements may be connected to the taps (22,23,24) of an input potential divider in a cyclical manner and the output signals of the three resulting arrangements combined by means of logic gates to produce pulses which occur once every 60° of the input waveform. The output signal may be used as a reference signal to enable control signals for thyristors included in a control circuit for apparatus energized from the AC supply.

16 Claims, 3 Drawing Figures

WAVEFORM CROSSING DETECTOR

This invention relates to a circuit arrangement for detecting those instants at which the difference between the voltage on a first conductor of an alternating current supply and the voltage on a second conductor of said alternating current supply passes through substantially zero in a given sense, said arrangement comprising a photo-emissive semiconductor junction, a photo-sensitive element situated in a path for radiation from said photo-emissive semiconductor junction, and a forward-current supply circuit for said photo-emissive semiconductor junction, said forward-current supply circuit having a control input connected between said first and second conductors and being constructed to supply said photo-emissive semiconductor junction with forward current in response to each passage of said difference through substantially zero in said given sense.

Such arrangements are often required, for example, for controlling thyristors included in a control circuit for apparatus fed from the a.c. supply. The radiation coupling between the photo-emissive semiconductor junction and the photo-sensitive element can in such a context provide electrical isolation between the a.c. supply and the control circuit. If the photo-emissive semiconductor junction were merely connected (with a series resistor) directly between the conductors it would, because of threshold and capacitive effects etc., be likely to start and stop emitting at instants which are appreciably different from those at which said difference is zero. For this reason it is desirable to provide some sort of forward-current supply circuit for the junction, which circuit has a faster response than has the simple series combination of the junction and a resistor. However, because such a supply circuit has to be connected to the a.c. supply side of the radiation coupling it either has to be powered from the a.c. supply itself or be provided with its own separate power supply. The latter possibility is obviously undesirable and the former possibility is difficult to achieve in a simple manner if power is taken from the said conductors because the potential between them is zero just at the instants at which the supply circuit is required to be at its most sensitive.

It is known, for example from British Patent Specification No. 1,460,068, to power such a supply circuit from a single-phase supply via a rectifier, the output of the rectifier being connected to a capacitor which ensures that power is available for the supply circuit at the zero crossing instants. In this known arrangement the supply circuit is a threshold or trigger circuit including NAND gates connected in a positive feedback arrangement, and is rather complicated.

It is an object of the invention to enable a simpler supply circuit to be used in cases where the a.c. supply is a three-phase one.

The invention provides a circuit arrangement for detecting those instants at which the difference between the voltage on a first conductor of an alternating current supply and the voltage on a second conductor of said alternating current supply passes through substantially zero in a given sense, said arrangement comprising a photo-emissive semiconductor junction, a photo-sensitive element situated in a path for radiation from said photo-emissive semiconductor junction, and a forward-current supply circuit for said photo-emissive semiconductor junction, said forward-current supply circuit having a control input connected between said first and second conductors and being constructed to supply said photo-emissive semiconductor junction with forward current in response to each passage of said difference through substantially zero in said given sense, characterized in that said first and second conductors are first and second phase conductors respectively of a three-phase alternating current supply, in that the output current path of said supply circuit extends between the third phase conductor of said three-phase alternating current supply and one of said first and second phase conductors, and in that said photo-emissive semiconductor junction is included in said output current path between said forward-current supply circuit and said third phase conductor.

It has now been recognised that, because when the potentials on two conductors of a three-phase supply are equal to each other the potential on the third conductor of the supply is a maximum, the last mentioned potential is highly suitable for powering a forward current supply circuit for a photo-emissive semiconductor junction included in a detector for those instants at which the difference between the two first-mentioned potentials passes through zero in a given sense. This enables the forward current supply circuit to be very simple.

The arrangement can also detect those instants at which said difference passes through substantially zero in a sense opposite to said given sense, if it also comprises a second photo-emissive semiconductor junction, a photo-sensitive element situated in a path for radiation from said second photo-emissive semiconductor junction, and a second forward-current supply circuit for said second photo-emissive semiconductor junction, said second forward current supply circuit having a control input connected between said first and second phase conductors and being constructed to supply said second photo-emissive semiconductor junction with forward current in response to each passage of said difference through substantially zero in a sense opposite to said given sense, the output current path of said second forward-current supply circuit extending between said third phase conductor and one of said first and second phase conductors and said second photo-emissive semiconductor junction being included therein between said second forward-current supply circuit and said third phase conductor with a polarity relative to said third phase conductor which is opposite to that of the first-mentioned photo-emissive semiconductor junction relative to said third phase conductor. This can be an advantage if, for example, the arrangement is used to control a phase-locked-loop as two reference instants per 360° of the waveform of the a.c. supply can provide better control than one.

The or each forward-current supply circuit may comprise a transistor having its control electrode connected to one of said first and second phase conductors, its common electrode connected to the other of said first and second phase conductors, and its output electrode connected to said third phase conductor via the corresponding photo-emissive semiconductor junction. If two forward-current supply circuits are present the two transistors should be of mutually opposite conductivity type and the control electrodes of both should be connected to the same one of said first and second phase conductors and the common electrodes of both should be connected to the other of said first and second phase conductors. A particularly simple arrangement can be obtained in this way.

If two forward-current supply circuits are present in the arrangement, apparatus for detecting those instants at which the voltage difference between any two phase conductors of a three-phase alternating current supply is substantially zero may be formed from first, second and third such arrangements which are connected to said three-phase supply in such manner that the two said output current paths of each arrangement extend between a pair of phase conductors of said supply which is different to the pairs of phase conductors between which the two said output current paths of each of the other two arrangements extend. Reference signals which enable control signals for the six thyristors of a full wave thyristor rectifier circuit for the a.c. supply to be generated can be derived from the outputs of the three arrangements in such an apparatus.

If desired the output signals from the three arrangements in such an apparatus may be combined by feeding first, second and third OR, NAND, NOR or AND gate circuits with the output signals of the first and second, the second and third, and the first and third arrangements respectively, and providing a further gate circuit having inputs connected to outputs of said first, second and third gates respectively, said further gate circuit being an AND or NAND gate circuit if the first, second and third gate circuits are OR or NAND gate circuits and being an OR or NOR gate circuit if the first, second and third gate circuits are OR or NOR gate circuits. Such apparatus can provide a composite signal comprising an output pulse every 60° of the a.c. supply waveform, which signal can be very suitable for controlling a phase-locked-loop.

If such a phase locked loop is provided it can be a disadvantage that the output signal of the further gate circuit becomes inverted if the phase order of the a.c. voltage waveform becomes reversed. Correction for such an effect can be made by including a controllable inverter circuit in a signal path from the output of said further gate circuit, which inverter circuit is switchable, in dependence upon the value of a control signal at a control input thereof, between a first state in which it inverts signals transmitted thereby and a second state in which it does not invert signals transmitted thereby, a D-type flip-flop, a coupling from the output of said first arrangement to the D-input of said flip-flop, a coupling from the output of said second arrangement to the clock input of said flip-flop, and a coupling from the output of said flip-flop to said control input. If this is done the flip-flop will change state upon reversal of the input phase order, thereby correcting the output signal.

In order that the apparatus can also generate a single pulse every 360° of the input a.c. waveform, thereby providing an initial reference point on the waveform (which may be required by further circuitry) a controllable switch may be provided in series with both photo-sensitive elements of said third arrangement and one photo-sensitive element of said second arrangement. When said switch is opened it can be arranged that said single pulses are generated.

Embodiments of the invention will now be described, by way of example, with reference to the accompanying diagrammatic drawings in which.

Figure 1:
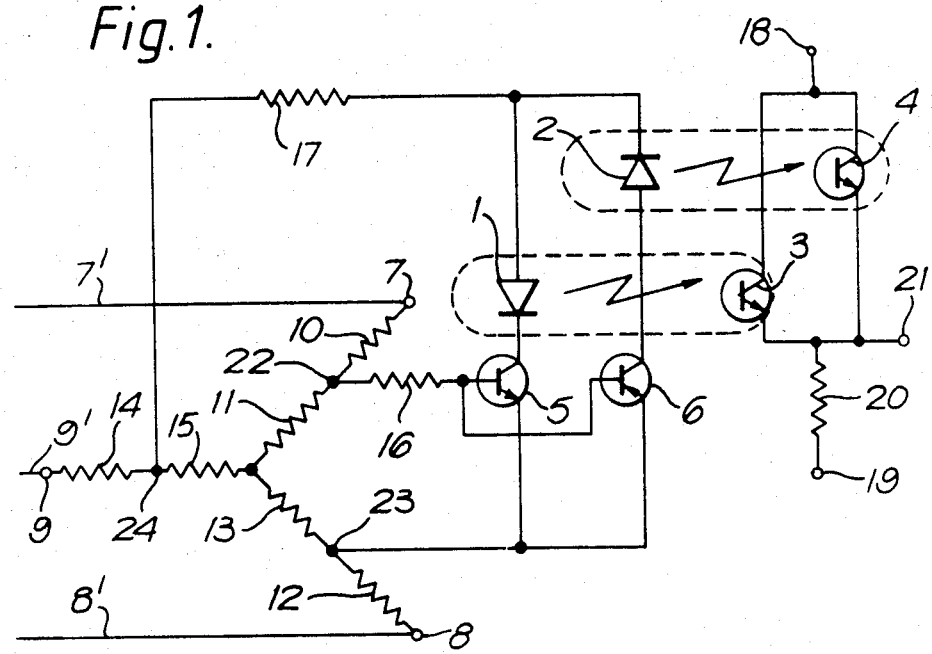
FIG. 1 shows a first embodiment.

In FIG. 1 a circuit arrangement for detecting those instants at which the difference between the voltage on a first conductor of a three-phase alternating current supply and the voltage on a second conductor of said supply passes through zero in either sense comprises first and second photo-emissive semiconductor junctions in the form of light-emitting diodes 1 and 2 respectively. First and second photo-sensitive elements in the form of photo-transistors 3 and 4 respectively are situated in radiation paths from the diodes 1 and 2 respectively. First and second forward-current supply circuits for the diodes 1 and 2 respectively include transistors 5 (npn) and 6 (pnp) respectively. The first, second and third phase conductors 7', 8' and 9' respectively of the supply are connected to input terminals 7, 8 and 9 respectively of potential dividers comprising resistors 10 and 11, resistors 12 and 13, and resistors 14 and 15 respectively. These potential dividers are connected in a star configuration. The tap 22 of the divider 10, 11 is connected to the bases of the transistors 5 and 6 via a common resistor 16. The tap 23 of the divider 12, 13 is connected directly to the emitters of the transistors 5 and 6, and the tap 24 of the divider 14, 15 is connected to the collectors of the transistors 5 and 6 via the diodes 1 and 2 respectively and a common resistor 17. Diodes 1 and 2 have mutually opposite polarities with respect to the terminal 9 and are connected in the forward direction for the collector currents of the respective transistors 5 and 6. The collectors of the photo-transistors 3 and 4 are connected to the positive terminal 18 of a d.c. supply, and the emitters thereof are connected both to the negative terminal 19 of the d.c. supply via a common load resistor 20, and also to an output terminal 21. The base-emitter junctions of the transistors 5 and 6 constitute control inputs of the aforesaid first and second forward-current supply circuits respectively and, in operation, transistor 5 supplies diode 1 with forward current in response to each passage of the voltage difference between terminals 7 and 8 through zero in a given sense and transistor 6 supplies diode 2 with forward current in response to the passage of this difference through zero in the opposite sense.

Figure 2:
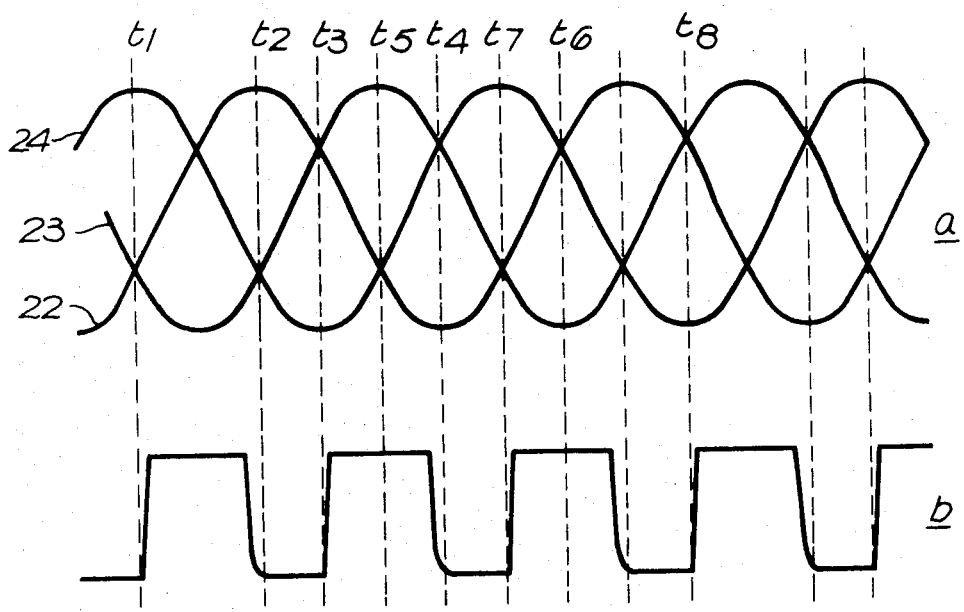
FIGS. 2a and 2b show some voltage waveforms illustrating the operation of the embodiment of FIG. 1.

FIG. 2a shows the variation of the voltages at the taps 22, 23 and 24 respectively in FIG. 1 with time, each waveform being given the same reference as the tap to which it corresponds. Each waveform has a peak-to-peak amplitude of, for example, 10 volts. At time t1 the voltage at tap 22 becomes more positive than the voltage at tap 23, with the result that the base-emitter junction of transistor 5 becomes forward-biassed. A short time later the base-emitter junction threshold voltage of transistor 5 is exceeded and transistor 5 supplies diode 1 with forward current. The voltage at tap 24 is substantially a maximum in a positive sense at this time so that the diode current builds up very rapidly, resulting in abrupt conduction in photo-transistor 3 and hence in a steeply rising positive edge at output terminal 21. The variation of the voltage at output terminal 21 with time is shown in FIG. 2b. Conduction continues in diode 1 until just before the time t2 at which the voltage at the tap 24 becomes more negative than that at the tap 23. Conduction ends when the voltage between taps 24 and 23 decreases to the threshold voltage of diode 1, for example to 1 volt. When this occurs the voltage at output terminal 21 drops to zero again.

At a subsequent time t3 the voltage at tap 22 becomes more negative than that at tap 23 with the result that the base-emitter junction of transistor 6 becomes forward-biassed. A short time later the base-emitter junction threshold voltage of transistor 6 is exceeded and transistor 6 supplies diode 2 with forward current. The voltage at tap 24 is substantially a maximum in a negative sense at this time so that the diode current builds up very rapidly, resulting in abrupt conduction in phototransistor 4 and hence in another steeply rising positive edge at output terminal 21 (see FIG. 2b). Conduction continues in diode 2 until just before the time t4 at which the voltage at the tap 24 becomes more positive than that at the tap 23. Conduction ends when the voltage between taps 24 and 23 decreases to the threshold voltage of diode 2. When this occurs the voltage at output terminal 21 drops to zero again. The rising edges of the voltage at output terminal 21 are much sharper than the falling edges thereof due to the facts that (a) the collector-emitter supply voltage to the relevant transistor is substantially a maximum when each diode conducts, i.e. when the rising edges occur, and the relevant transistor has no effect when each diode ceases to conduct, i.e. when the falling edges occur and (b) charge carriers are generated rapidly in each transistor when that transistor conducts and are generated rapidly in each photo-transistor when the relevant diode conducts, but these charge carriers take an appreciable time to recombine when the relevant transistor and diode cease to conduct. It will be seen that the rising edges occur at those instants at which the difference between the voltage on the phase conductor connected to terminal 7 and the voltage on the phase conductor connected to terminal 8 passes through substantially zero in either direction, these instants occurring at 180° intervals of the input waveform.

If, for example, transistor 6, diode 2 and photo-transistor 4 are omitted, alternate pulses, e.g. the pulse between instants t3 and t4 in FIG. 2b, will not occur in the output waveform at terminal 21 so that the arrangement will then detect only those instants at which the voltage at terminal 7 becomes positive with respect to the voltage at terminal 8. Similarly, if transistor 5, diode 1 and photo-transistor 3 are omitted the arrangement will detect only those instants at which the voltage at terminal 7 becomes negative with respect to the voltage at terminal 8.

Obviously photo-transistors 3 and 4 may be replaced by a single photo-transistor included in radiation paths from both diodes 1 and 2. Moreover the transistors 5 and/or 6 may be replaced by other forms of forward-current supply circuits for the respective diodes 1 and 2, constructed in such manner that they will supply the relevant diode with forward current in response to each passage of the difference between the voltages on the terminals 7 and 8 through zero in one and the other sense respectively. Thus transistors 5 and/or 6 may be replaced, for example, by respective Darlington transistor pairs of corresponding conductively type or respective more complex threshold-responsive circuits, for example multi-stage amplifiers or Schmitt triggers.

It might be thought that resistor 16 could be fed from tap 23 instead of tap 22 provided that the emitters of transistors 5 and 6 are fed from tap 22 instead of tap 23, resulting in transistors 5 and 6 conducting comparatively slowly after instants t5 and t6 respectively in FIG. 2a and turning off substantially at instants t7 and t8 respectively. If this is done, such an arrangement has been found to be rather unsatisfactory due to the aforesaid rather long recombination time for charge carriers in the phototransistors 3 and 4 and the transistors 5 and 6, resulting in both the leading and the trailing edges of the output signal at terminal 21 being ill-defined.

Obviously the phototransistors 3 and 4 may be replaced by other forms of photo-sensitive element, for example simple photo-conductive cells, although these alternatives tend in practice to be rather too sluggish in operation.

If the load resistor 20 is included in the common collector lead of the photo-transistors 3 and 4 instead of in the common emitter lead thereof the output signal of FIG. 2b will, of course, be inverted.

Figure 3:
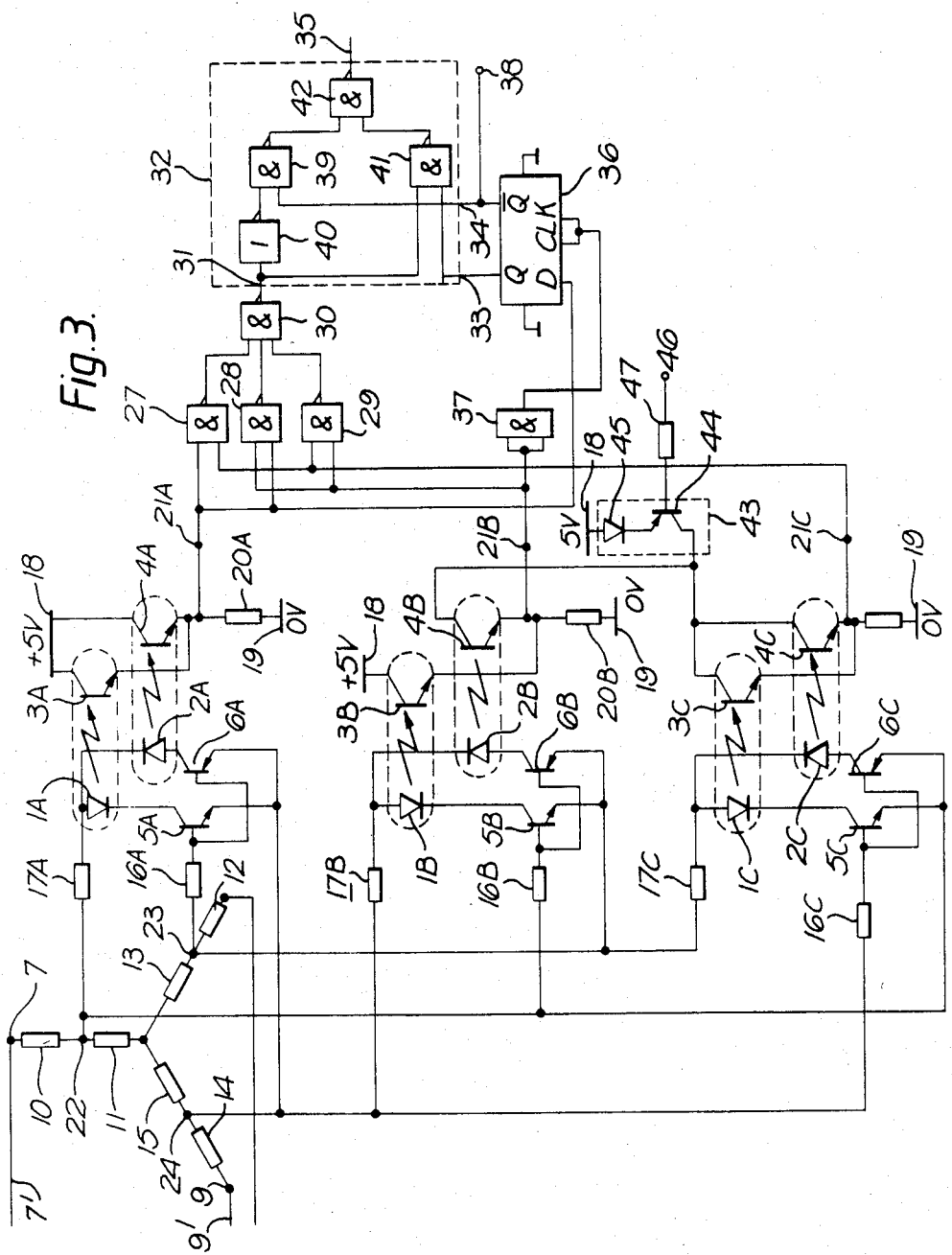
FIG. 3 shows apparatus including three circuits each constructed as shown in FIG. 1.

The arrangements described with reference to FIG. 1 produce two sharply defined edges in its output signal for each 360° of the input three-phase waveform, these edges being spaced by 180°. If six such edges are required for each 360° of the waveform, spaced by 60°, then three arrangements each as described with reference to FIG. 1 may be connected to the taps 22–24 of the input potential divider in a mutually staggered manner. An example of such a combination is shown at the left-hand side of FIG. 3, which is a circuit diagram of apparatus for detecting those instants at which the voltage difference between any two phase conductors of a three-phase alternating current supply is substantially zero. In FIG. 3 the various components of the three arrangements (each as shown in FIG. 1) have the suffixes A, B and C respectively. It will be noted that the three arrangements are connected to the taps 22-24 of the input potential divider in such manner that the collector-emitter paths of the pair of transistors 5 and 6 of each arrangment extend between a different pair of taps to those between which the corresponding paths of each of the other arrangements extend. The result is that the 180°-spaced leading edges of the signals occurring at the output terminals 21A, 21B and 21C are each displaced by 60° relative to those occurring at the other two of these output terminals.

Although the three output signals may be utilized separately, in the apparatus of FIG. 3 they are combined by a system of gates to form a composite output signal consisting of six equally-spaced pulses per 360°, each pulse having a well-defined leading edge which substantially coincides with the corresponding zero-crossing point in the input waveform (cf. the instant t1 in the waveform of FIG. 2a) and a less well-defined trailing edge which occurs less than 60° later. The system of gates comprises first, second and third NAND gates 27, 28 and 29 respectively, and a further NAND gate 30 at the output of which the composite signal occurs. The inputs of gate 27 are connected to the output terminals 21A and 21C respectively, the inputs of the gate 28 are connected to the output terminals 21A and 21B respectively, and the inputs of the gate 29 are connected to the output terminals 21B and 21C respectively. The inputs of the gate 30 are connected to the outputs of the gates 27, 28 and 29 respectively. It will be evident that the gate 30 may be replaced by an AND gate and the gates 27–29 may be replaced by OR gates. Moreover, the gates 27–29 may be replaced by NOR or AND gates provided that gate 30 is replaced by an OR or NOR gate. The resistors 20 effectively peform OR operations on the output signals of the corresponding photo-transistors 3 and 4. Obviously if they are transferred to the collector circuits of the photo-transistors they will perform NOR operations thereon. As described with reference to FIG. 1 each pair of photo-transistors 3, 4 may be replaced by a single photo-transistor.

If the phases applied to the input terminals 7, 8 and 9, for example the R, S and T phases respectively, occur in that order, the well-defined edges in the output pulses of gate 30 will be positive-going (assuming positive logic), whereas if the phase order is reversed the corresponding edges will be negative-going. This could cause problems, for example if the output signal is applied to a phase-locked-loop which might then respond to the incorrect edges. In order to produce an output signal which always has the correct polarity the output of gate 30 is applied to the input 31 of a controllable inverter circuit 32 which has a control input 33, 34 and an output 35. The control input 33, 34 is fed from the Q and $\bar{Q}$ outputs of a D-type flip-flop 36 the D-input of which is fed from the terminal 21A and the clock input of which is fed from the terminal 21B via an AND gate 37 which has paralleled inputs and is provided for waveform-squaring purposes. When the phases at the terminals 7, 8 and 9 occur in that order, flip-flop 36 is put into the set state by means of the signals at the terminals 21A and 21B. The flip-flop controls the circuit 32 to transmit the signals at its input 31 to its output 35 in unchanged, i.e. non-inverted form. If the phase order is reversed, however, flip-flop 36 is put into the reset state, by means of the signals at the terminals 21A and 21B and controls the circuit 32 to transmit the signals at its input 31 to its output 35 in inverted form. The state of flip-flop 36 may be transmitted to further circuitry as phase-order information, if desired, via an output terminal 38.

Controllable inverter circuit 32 comprises a NAND gate 39 to one input of which the input 31 is coupled via an inverter 40. A NAND gate 41 has one input to which the input 31 is connected directly. A NAND gate 42 has two inputs which are fed from the outputs of the gates 39 and 41 respectively and an output which is connected to the output 35. The control input terminals 33 and 34 are connected to the other inputs of the gates 39 and 41.

A controllable switch 43 is included in the apparatus of FIG. 3 in the connection from the positive supply terminal 18 to one photo-transistor 4B of the arrangement denoted by the suffix B and both photo-transistors 3C and 4C of the arrangement denoted by the suffix C. Switch 43 comprises a pnp transistor 44 the emitter of which is connected to terminal 18 via a diode 45 and the collector of which is connected to the collectors of the photo-transistors 4B, 3C and 4C. The base of transistor 44 is fed from a control input terminal 46 via a resistor 47.

It has been assumed in the above description that the potential at terminal 46 is "low" and hence that transistor 44 is conductive. If transistor 44 is turned off by making the potential at terminal 46 high, the outputs of gates 27 and 29 assume a steady logic "1" condition, and the signal at terminal 21B now consists of only one pulse per 360° of the input signal. The result is that the signal at the output 35 of the apparatus now consists of only one pulse per 360° of the input signal, the leading edge thereof occurring at a specific cross-over point on the input voltage waveform. Such an output signal can be useful to provide an initial reference for other circuitry, for example a trigger circuit for thyristors included in a three-phase power control circuit, which control circuit includes a phase-locked-loop fed from the output 35.

Various components of the apparatus of FIG. 3 may be of the following types or have the following values:

| | |
|---|---|
| Resistors 10, 12, 14 | 8.2K ohms (5 watt) |
| Resistors 11, 13, 15 | 150 ohms |
| Resistors 17A, 17B and 17C | 22K ohms |
| Resistors 16A, 16B and 16C | 22K ohms |
| Resistors 20A, 20B and 20C | 22K ohms |
| Resistor 47 | 22K ohms |
| Transistors 5A, 5B and 5C | BC 337 |
| Transistors 6A, 6B and 6C | BC 327 |
| Transistor 44 | BC 327 |
| Diode 45 | BAW 62 |
| Opto-couplers 1A, 3A; 2B, 3B and 2C, 3C | CNY 62. |

The transistors, diode and opto-couplers are obtainable under the Registered Trade Mark "Mullard".

I claim:

1. A circuit arrangement for detecting the instants at which the difference between voltages on first and second conductors of an alternating current supply pass through substantially zero in a given sense comprising: a photo-emissive semiconductor junction, a photo-sensitive element situated in a radiation path of said photo-emissive semiconductor junction, and a forward-current supply circuit for said photo-emissive semiconductor junction, said forward-current supply circuit having a control input connected between said first and second conductors and being arranged to supply said photo-emissive semiconductor junction with forward current in response to each passage of said difference through substantially zero in said given sense, said first and second conductors being first and second phase conductors respectively of a three-phase alternating current supply, circuit means providing an output current path of said supply circuit between a third phase conductor of said three-phase alternating current supply and one of said first and second phase conductors, said photo-emissive semiconductor junction being connected in said output current path between said forward-current supply circuit and said third phase conductor.

2. An arrangement as claimed in claim 1, wherein said forward-current supply circuit comprises a transistor having a control electrode connected to one of said first and second phase conductors, a common electrode connected to the other of said first and second phase conductors, and an output electrode connected to said third phase conductor via said photo-emissive semiconductor junction.

3. An arrangement as claimed in claim 1 or claim 2, wherein for detecting the instants at which said difference passes through substantially zero in a sense opposite to said given sense, said arrangement further comprises: a second photo-emissive semiconductor junction, a photo-sensitive element in a radiation path of said second photo-emissive semiconductor junction, and a second forward-current supply circuit for said second photo-emissive semiconductor junction, said second forward-current supply circuit having a control input connected between said first and second phase conductors so as to supply said second photo-emissive semiconductor junction with forward current in response to each passage of said difference through substantially zero in a sense opposite to said given sense, an output current path of said second forward-current supply circuit being connected between said third phase conductor and one of said first and second phase conductors with said second photo-emissive semiconductor junction being connected between said second forward-current supply circuit and said third phase conductor and with a polarity relative to said third phase conductor which is opposite to that of the first photo-emissive semiconductor junction relative to said third phase conductor.

4. An arrangement as claimed in claim 3 when appended to claim 2, wherein said second forward-current supply supply circuit comprises a second transistor of opposite conductivity type to the first transistor, said second transistor having a control electrode connected to that one of said first and second phase conductors to which the control electrode of the first transistor is connected, a common electrode connected to the other of said first and second phase conductors, and an output electrode connected connected to said third phase conductor via said second photo-emissive semiconductor junction.

5. Apparatus for detecting the instants at which the voltage difference between any two phase conductors of a three-phase alternating current supply is substantially zero, said apparatus comprising first, second and third arrangements each as claimed in claim 3 and connected to said three-phase supply such that the two said output current paths of each arrangement extend between a pair of phase conductors of said supply which is different from the pair of phase conductors between which the two said output current paths of each of the other two arrangements extend.

6. Apparatus as claimed in claim 5 wherein, in each said arrangement, the photo-sensitive elements comprise two separate photosensitive elements, first, second and third means for performing OR or NOR operations on output signals from the two photo-sensitive elements of said first, second and third arrangements respectively, first, second and third OR, NAND, NOR or AND gate circuits each having a pair of inputs, the inputs of the first gate circuit being connected to outputs of the first and second means respectively, the inputs of the second gate circuit being connected to outputs of the second and third means respectively, and the inputs of the third gate circuit being connected to outputs of the first and third means respectively, and a further gate circuit having inputs connected to outputs of said first, second and third gate circuits, said further gate circuit being an AND or NAND gate circuit if the first, second and third gate circuits are OR or NAND gate circuits and being an OR or NOR gate circuit if the first, second and third gate circuits are NOR or AND gate circuits.

7. Apparatus as claimed in claim 5 wherein, in each said arrangement, the photo-sensitive elements comprise a single photo-sensitive element, first, second and third OR, NAND, NOR or AND gate circuits each having a pair of inputs, the inputs of the first gate circuit being connected to outputs of the photo-sensitive elements of the first and second arrangements respectively, the inputs of the second gate circuit being connected to outputs of the photo-sensitive elements of the second and third arrangements respectively, and the inputs of the third gate circuit being connected to outputs of the photo-sensitive elements of the first and third arrangements respectively, and a further gate circuit having inputs connected to outputs of said first, second and third gate circuits, said further gate circuit being an AND or NAND gate circuit if the first, second and third gate circuits are OR or NAND gate circuits, and being an OR or NOR gate circuit if the first, second and third gates are NOR or AND gate circuits.

8. Apparatus as claimed in claim 6, further comprising a controllable inverter circuit connected in a signal path from an output of said further gate circuit, said inverter circuit being switchable, in dependence upon the value of a control signal at a control input thereof, between a first state in which it inverts signals transmitted thereby and a second state in which it does not invert signals transmitted thereby, a D-type flip-flop, means coupling the output of said first means to the D-input of said flip-flop, means coupling the output of said second means to a clock input of said flip-flop, and means coupling an output of said flip-flop to said control input of the inverter circuit.

9. Apparatus as claimed in claim 7, further comprising a controllable inverter circuit connected in a signal path from an output of said further gate circuit, said inverter circuit being switchable, in dependence upon the value of a control signal at a control input thereof, between a first state in which it inverts signals transmitted thereby and a second state in which it does not invert signals transmitted thereby, a D-type flip-flop, means coupling the output of the photo-sensitive element of the first arrangement to the D-input of said flip-flop, means coupling the output of the photo-sensitive element of the second arrangement to a clock input of said flip-flop, and means coupling an output of said flip-flop to said control input of the inverter circuit.

10. Apparatus as claimed in claim 6 or claim 8, further comprising a controllable switch in series with both photo-sensitive elements of said third arrangement and one of the photo-sensitive elements of said second arrangement.

11. Apparatus as claimed in claim 5 wherein said first, second and third arrangements each comprise first and second photo-sensitive elements individually optically coupled to the first and second photo-emissive semiconductor junctions of its respective arrangement, and a logic circuit coupled to the photo-sensitive elements of the first, second and third arrangements so as to combine the output signals produced thereby so as to derive at an output of the logic circuit six equally spaced signal pulses per cycle of the three-phase AC supply.

12. Apparatus as claimed in claim 11 wherein the first and second photo-sensitive elements of each of said arrangements are coupled together in a respective OR circuit each having a single output and the logic circuit comprises, first, second and third two-input NAND gates, means coupling the two inputs of the first NAND gate to outputs of the OR circuits of the first and second arrangements, means coupling the two inputs of the second NAND gate to outputs of the OR circuits of the second and third arrangements, means coupling the two inputs of the third NAND gate to outputs of the OR circuits of the first and third arrangements, and a fourth NAND gate having first, second and third inputs connected to outputs of the first, second and third NAND gates, respectively, and an output at which said equally spaced signal pulses are produced.

13. Apparatus for detecting the instants in time at which the voltage difference betweeen first and second conductors of a three-phase AC electric supply pass through zero in a given sense comprising: first, second and third input terminals for connection to first, second and third phase conductors of the three-phase AC supply, a photo-emissive semiconductor junction, a photo-sensitive element adapted to be optically coupled to the photo-emissive semiconductor junction, a controlled switching device connected in series circuit with said photo-emissive semiconductor junction between said third input terminal and one of said first and second input terminals to form a forward-current supply circuit for the photo-emissive semiconductor junction, means coupling a control input of the switching device to said first and second input terminals in a manner such that the switching device passes a forward-current through said photo-emissive semiconductor junction for each passage of said voltage difference through zero in said given sense.

14. Apparatus as claimed in claim 13 wherein the switching device comprises a transistor having a control electrode coupled to one of said first and second input terminals, a common electrode coupled to the other of said first and second input terminals, and an output electrode coupled to said third input terminal via said photo-emissive semiconductor junction.

15. Apparatus as claimed in claim 13 further comprising first, second and third voltage dividers connected in Y-configuration between said first, second and third input terminals, each of said voltage dividers having a tap point with the tap points on the first and second voltage dividers connected to the control input of the switching device and the tap point of the third voltage divider connected to said series circuit of the switching device and photo-emissive semidconductor junction.

16. Apparatus as claimed in claim 13 further comprising a second series circuit of a second controlled switching device and a second photo-emissive semiconductor junction connected in anti-parallel with the first series circuit including the first controlled switching device and the first photo-emissive semiconductor junction, and means coupling a control input of the second controlled switching device to said first and second input terminals so as to pass a forward-current through the second switching device and the second photo-emissive semiconductor junction for each passage of said voltage difference through zero in a sense opposite to said given sense.

* * * * *